United States Patent [19]
Tso et al.

[11] Patent Number: 5,287,311
[45] Date of Patent: Feb. 15, 1994

[54] METHOD AND APPARATUS FOR IMPLEMENTING X2 PARITY DRAM FOR 16 BIT SYSTEMS FROM X4 PARITY DRAM

[75] Inventors: Jim C. Tso, Sugarland; Vipul Patel; Kenneth A. Poteet, both of Houston, all of Tex.

[73] Assignee: Texas Instruments Incorporated, Dallas, Tex.

[21] Appl. No.: 708,594

[22] Filed: May 31, 1991

[51] Int. Cl.[5] .................................. G11C 7/00
[52] U.S. Cl. ................... 365/201; 365/225.7
[58] Field of Search ............... 365/201, 225.7, 230.03, 365/189.08, 200; 371/10.1

[56]   References Cited
U.S. PATENT DOCUMENTS

| | | | |
|---|---|---|---|
| 4,703,436 | 10/1987 | Varshney | 365/201 X |
| 5,109,360 | 4/1992 | Inazumi et al. | 365/230.03 X |
| 5,126,973 | 6/1992 | Gallia et al. | 365/230.03 X |

*Primary Examiner*—Steven Mottola
*Attorney, Agent, or Firm*—Ronald O. Neerings; Rose K. Castro; Richard L. Donaldson

[57]   ABSTRACT

A 1M×2 parity DRAM is salvaged from a defective 1M×4 parity DRAM having two or less unrepairable memory quadrants. Circuits are designed so "any" combination of 2 good quadrants can be accessed as a result of fuse blowing and steering logic which is controlled by the fuse signals.

16 Claims, 3 Drawing Sheets

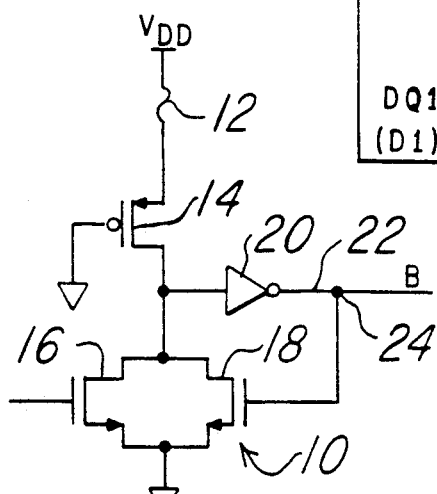
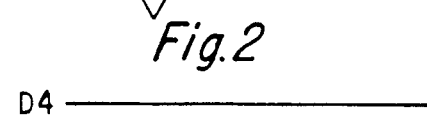
Fig.2
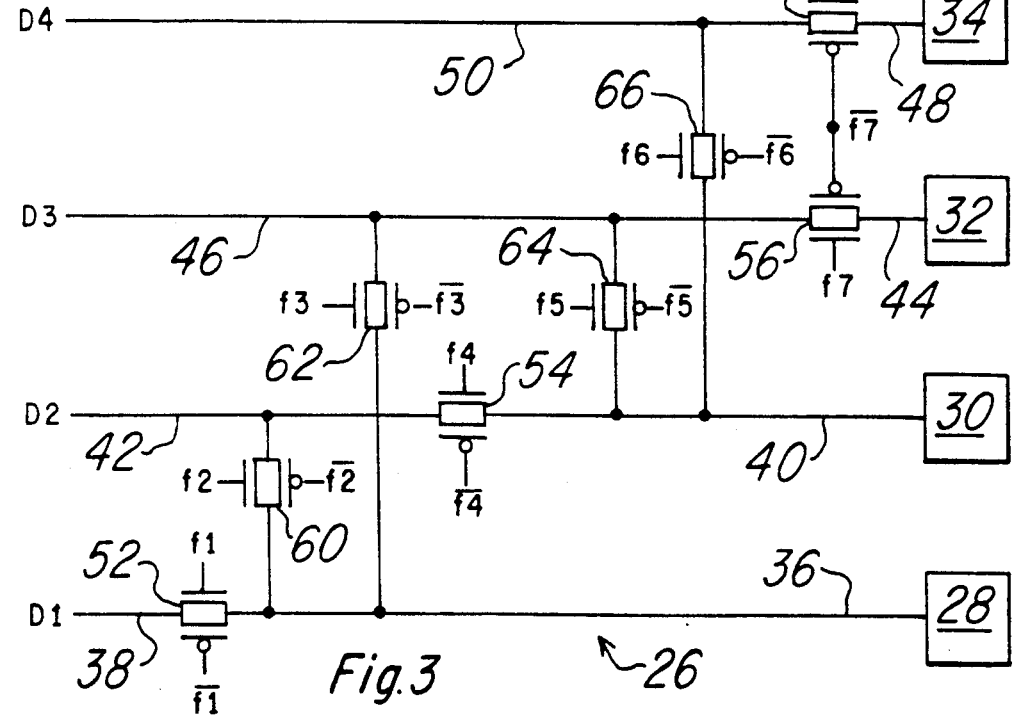
Fig.3

1MEGX4 PINOUT

```
DQ1  [1    26] Vss
DQ2  [2    25] DQ4
/WE  [3    24] DQ3
/RAS [4    23] /CAS4
/CAS1[5    22] /OE
/CAS2[6    21] /CAS3
  |         |
A9   [8    19] NC
A0   [9    18] A8
A1   [10   17] A7
A2   [11   16] A6
A3   [12   15] A5
Vcc  [13   14] A4
```

1MEGX2 PINOUT

```
DQ1  [1    26] Vss
DQ2  [2    25] NC
/WE  [3    24] NC
/RAS [4    23] NC
/CAS1[5    22] /OE
/CAS2[6    21] NC
  |         |
A9   [8    19] NC
A0   [9    18] A8
A1   [10   17] A7
A2   [11   16] A6
A3   [12   15] A5
Vcc  [13   14] A4
```

METHOD AND APPARATUS FOR IMPLEMENTING X2 PARITY DRAM FOR 16 BIT SYSTEMS FROM X4 PARITY DRAM

FIELD OF THE INVENTION

This invention relates to steering logic that provides access between an input and a quadrant of a multi-quadrant memory array. In particular, this invention relates to steering logic that provides access from two inputs to any combination of two good quadrants to salvage a 1M×2 parity DRAM from a 1M×4 parity DRAM having less or equal to two unrepairable quadrants.

BACKGROUND OF THE INVENTION

Electronic component manufacturers presently make 1M×1 and 1M×4 Dynamic Random Access Memories (DRAMs). Two 1M×1 DRAMs can be used for parity bits on 1M×16 bit systems. In a 1M×16 bit system, two 1M×1 DRAMs provide 2 parity bits for the 2 bytes of memory array. Four 1M×1 DRAMs may be combined to accommodate 1M×32 bit systems. A 1M×4 DRAM may also be used to accommodate a 1M×32 bit system. In a 1M×32 bit system, the 1M×4 parity DRAM provides 4 parity bits for the 4 bytes of memory array. Each of these devices is a manufacturing expense to the electronic component manufacturer.

Unfortunately, a 1M×4 parity DRAM does not have the flexibility to be used in 16 bit systems which require 2 separate row address strobes for interleaved accesses. Electronic component manufacturers presently use two 1M×1 DRAMs for parity bits in 16 bit systems. What is needed for yield improvement is a 1M×2 parity DRAM salvaged from a 1M×4 parity DRAM reject which has two or less unrepairable memory quadrants. This 1M×2 DRAM can be used to replace two 1M×1 DRAMs, thus saving the user board space and reducing cost.

SUMMARY OF THE INVENTION

In a 1M×4 parity DRAM, there are 4 quadrants of memory arrays accessed by 4 individual DQ pins. If any one of the quadrants is unrepairable by redundancy, the device will be scrapped as a reject in a traditional DRAM test flow. New circuitry and a new test flow are presented which salvage a 1M×2 parity DRAM from a 1M×4 parity DRAM having less or equal to two unrepairable memory quadrants. In the new test flow, one or two of the four fuses for the four quadrants are blown after laser probe testing to mask out the unrepairable quadrants. Any combination of two good quadrants can be accessed as a result of fuse blowing and steering logic which is controlled by the fuse signal.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a block diagram of a 1M×4 parity DRAM having four memory quadrants accessed by four individual DQ pins.

FIG. 2 is an electrical schematic diagram of the fuse circuit, according to the invention.

FIG. 3 is an electrical schematic diagram of the pass gate steering logic circuit, according to the invention.

DETAILED DESCRIPTION OF THE INVENTION

Figure 5:
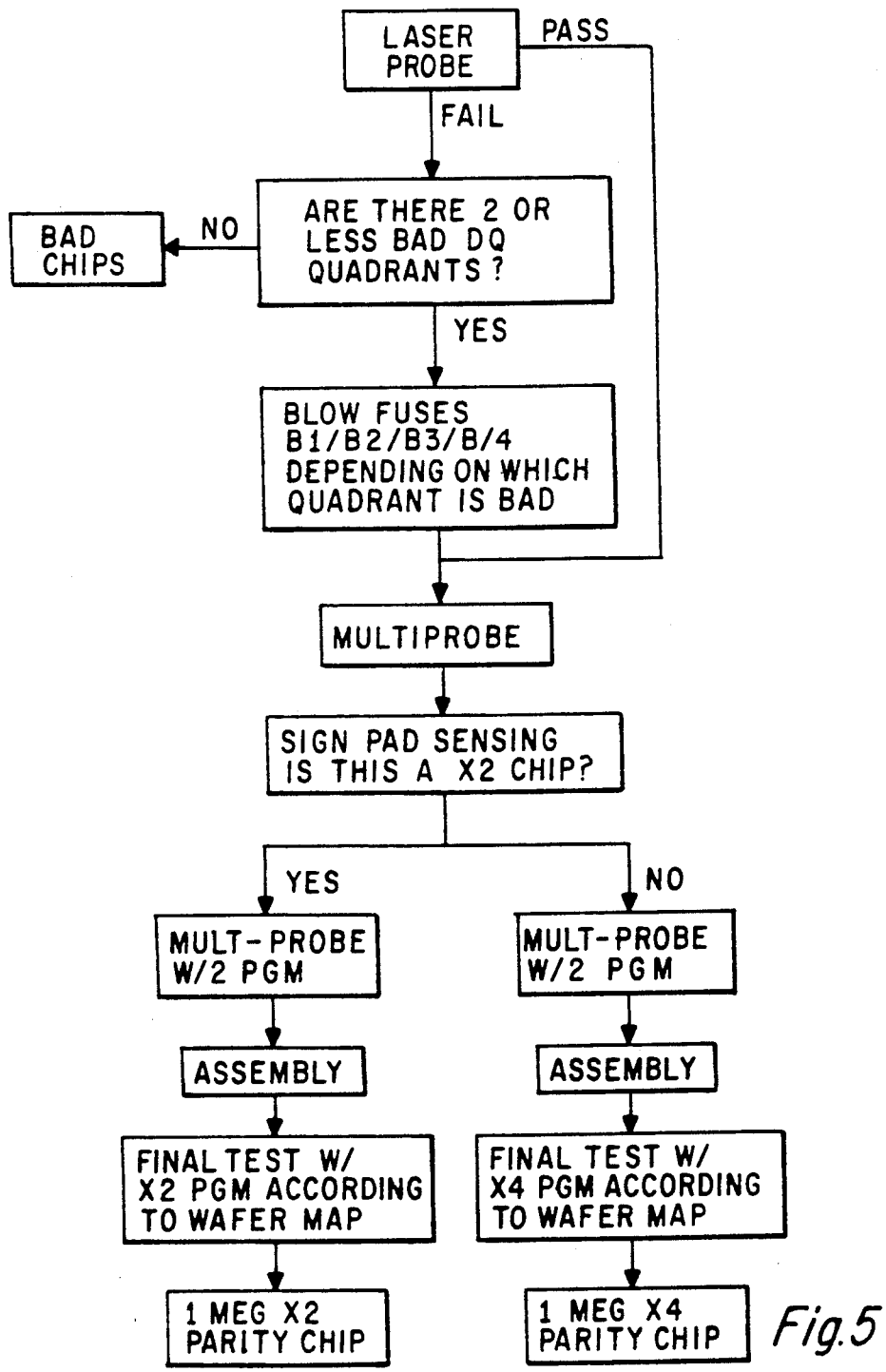
FIG. 5 is a flow chart of a test flow, according to the invention.

A fuse circuit and steering logic added to a 1M×4 parity DRAM facilitate salvaging a 1M×2 parity DRAM from a 1M×4 parity DRAM reject having two or less unrepairable memory quadrants.

FIG. 1 discloses a block diagram of a 1M×4 parity DRAM having four quadrants (D1-D4) of memory arrays accessed by four individual DQ pins (DQ1-DQ4), according to one embodiment of the invention. A 1M×4 parity DRAM having four functional quadrants may be programmed for use as a 1M×2 DRAM having at least two functional quadrants. From an economical point of view, it is preferable to use a scrapped 1M×4 parity DRAM: 1) having failed a standard laser probe test; 2) which cannot be repaired through redundant circuitry; and 3) which has less or equal to two unrepairable quadrants, for use as a 1M×2 DRAM.

Each of the four quadrants in the 1M×4 parity DRAM includes a fuse circuit. FIG. 2 discloses a fuse circuit generally at 10. Fuse circuit 10 includes a fuse 12 coupled between VDD and a source of a p-channel transistor 14. The channel of transistor 14 is connected to ground. The drain of transistor 14 is coupled to the sources of n-channel transistors 16, 18 and to the input of inverter 20. An output of inverter 20 is connected to a signal line 22. The channel of transistor 16 receives a power-up signal pulse (PBRID). The channel of transistor 18 is coupled to a node 24 on transmission line 22. The drains of transistors 16 and 18 are coupled to ground. The channel of transistor 16 is connected to a signal line. The fuse circuit generates a signal B on signal line 22. Signal B is low if fuse 12 is intact and high if fuse 12 is blown. Typically, the fuse of a good quadrant will be left intact and the fuse of a bad quadrant will be blown using a laser or other suitable method to mask out the unrepairable quadrant. The four fuse circuits of the 1M×4 parity DRAM generate signals B1-B4, respectively.

Preferably, the fuse circuit of FIG. 2 is used in conjunction with the invention. However, any circuit that generates a signal which goes high if the quadrant it represents is bad and stays low when the quadrant is good may be used to mask out the unrepairable quadrant.

Signals B1-B4 are transmitted to steering logic circuitry. FIG. 3 discloses circuitry, generally at 26, for steering memory quadrants D1-D4 to bond pads 28, 30, 32 and 34, respectively. Bond pads 28, 30, 32 and 34 are wire bonded to DQ pins DQ1-DQ4, respectively. Pass gate 52 couples signal line 36 to signal line 38. Pass gate 54 couples signal line 40 to signal line 42. Pass gate 56 couples signal line 44 to signal line 46. Pass gate 58 couples signal line 48 to signal line 50. Pass gates 60 and 62 also couple signal line 36 to signal lines 42 and 46, respectively. Pass gates 64 and 66 also couple signal line 40 to signal lines 46 and 50, respectively.

Figures 4, 6, 7:
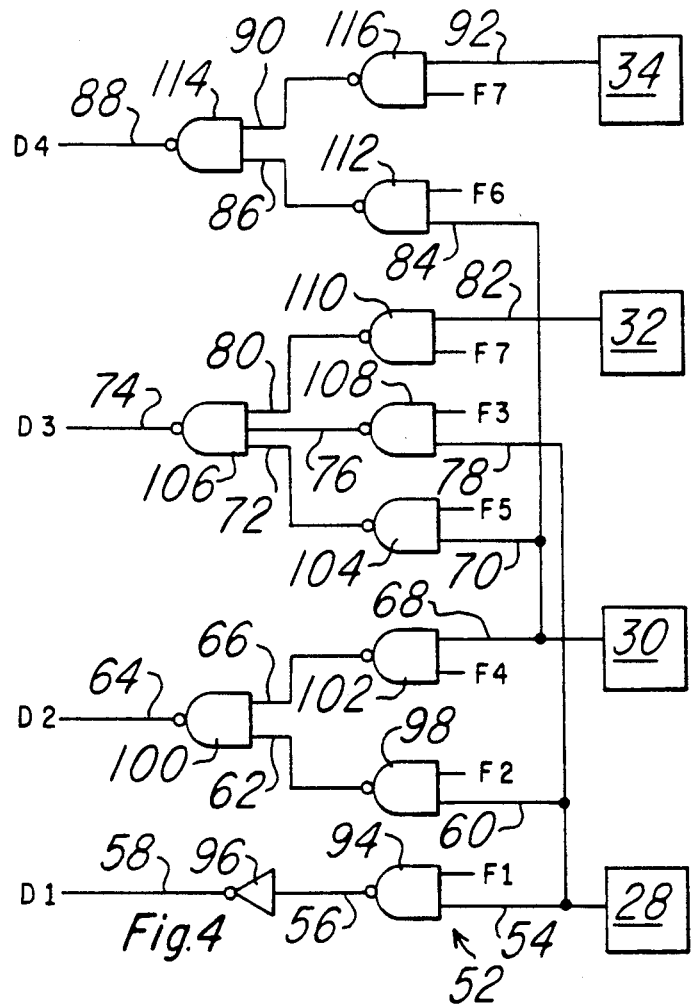
FIG. 4 is an electrical schematic diagram of an alternative steering logic circuit which uses logic gates.
FIG. 6 is a pinout of a 1M×4 parity DRAM having four good memory quadrants, according to the invention.
FIG. 7 is a pinout of a 1M×2 parity DRAM having two good memory quadrants, according to the invention.

FIG. 4 discloses another embodiment of the invention where logic gates, shown generally at 52, are used to implement the steering logic using the same decoding concept as used with the pass gate steering logic of FIG. 3. Previous reference numerals and identifiers are used where applicable.

A signal line 54 connects bond pad 28 to a first input of NAND gate 94. A second input of NAND gate 94 is responsive to logic function F1. Signal line 56 connects the output of NAND gate 94 to the input of an inverter 96. Signal line 58 connects the output of inverter 96 to memory quadrant D1.

Signal line 60 connects a first input of NAND gate 98 to signal line 54. A second input of NAND gate 98 is responsive to logic function F2. Signal line 62 connects the output of NAND gate 98 to a first input of NAND gate 100. Signal line 68 connects bond pad 30 to a first input of NAND gate 102. A second input of NAND gate 102 is responsive to logic function F4. Signal line 66 connects the output of NAND gate 102 to a second input of NAND gate 100. Signal line 64 connects the output of NAND gate 100 to memory quadrant D2.

Signal line 70 connects a first input of NAND gate 104 to signal line 68. A second input of NAND gate 104 is responsive to logic function F5. Signal line 72 connects the output of NAND gate 104 to a first input of NAND gate 106. Signal line 78 connects a first input of NAND gate 108 to signal lines 54 and 60. A second input of NAND gate 108 is responsive to logic function F3. Signal line 76 connects the output of NAND gate 108 to a second input of NAND gate 106. A first input of NAND gate 110 is responsive to logic function F7. Signal line 82 connects bond pad 32 to a second input of NAND gate 110. Signal line 80 connects the output of NAND gate 110 to a third input of NAND gate 106. Signal line 74 connects the output of NAND gate 138 to memory quadrant D3.

Signal line 84 connects a first input of NAND gate 112 to signal lines 68 and 70. A second input of NAND gate 112 is responsive to logic function F6. Signal line 86 connects the output of NAND gate 112 to an input of NAND gate 114. A first input of NAND gate 116 is responsive to logic function F7. Signal line 92 connects bond pad 34 to a second input of NAND gate 116. Signal line 90 connects the output of NAND gate 116 to a second input of NAND gate 114. Signal line 88 connects the output of NAND gate 114 to memory quadrant D4.

In operation, a 1M×4 parity DRAM includes a fuse circuit and steering logic, according to the invention. The DRAM is first tested with a probe test on every cell according to a standard test flow. If some bits fail, redundancy repair (i.e., redundant rows and columns) is used to replace bad bits. The DRAM is next tested using the self-explanatory flow chart disclosed in FIG. 5. If the DRAM has more than two bad quadrants, it is scrapped. If at least two of the quadrants are good, any combination of two good quadrants can be accessed as a result of fuse blowing and the steering logic which is controlled by the fuse signals.

DQ1 can be steered to three different quadrants depending on the condition of fuse signals B1-B4. Karnaugh maps may be used to determine which quadrants DQ1 and DQ2 access. A Karnaugh map of DQ1 via bond pad 28 accessing memory quadrants as a function of B1-B4 is shown below:

|       |    | B2/B1 |    |    |    |
|-------|----|----|----|----|----|
|       |    | 00 | 01 | 11 | 10 |
| B3/B4 | 00 | D1 | D2 | D3 | D1 |
|       | 01 | D1 | D2 | X  | D1 |
|       | 11 | D1 | X  | X  | X  |
|       | 10 | D1 | D2 | X  | D1 |

*X is don't care, which cases do not exist.

A "0" represents a low signal indicating that a memory quadrant is good and its fuse has not been blown. A "1" represents a high signal indicating that a memory quadrant is bad and its fuse has been blown. Thus, if B1/B2/B3/B4=1000 then DQ1 via bond pad 28 is steered to memory quadrant D2.

A Karnaugh map of DQ2 via bond pad 30 accessing memory quadrants as a function of B1-B4 is shown below:

|       |    | B2/B1 |    |    |    |
|-------|----|----|----|----|----|
|       |    | 00 | 01 | 11 | 10 |
| B3/B4 | 00 | D2 | D3 | D4 | D3 |
|       | 01 | D2 | D3 | X  | D3 |
|       | 11 | D2 | X  | X  | X  |
|       | 10 | D2 | D4 | X  | D4 |

*X is don't care, which cases do not exist.

From the above Karnaugh maps, one can derive logic functions to enable the paths between DQ1/DQ2 via their respective bond pads and memory quadrants D1-D4. A few of the more common logic functions are as follows:

```
1) DQ1 → D1 : F1=/B1
2) DQ1 → D2 : F2=B1*/B2
3) DQ1 → D3 : F3=B1*B2
4) DQ2 → D2 : F4=/B1*/B2
5) DQ2 → D3 : F5=/B2*B1*/B3=B2*/B1*/B3
6) DQ2 → D4 : F6=B2*B1+B1*/B3+B2*B3
7) IF NO BAD QUADRANT,
   F7=/b1*/b2*/b3*/b4=1 ← true for x4 parity
```

NOTE: "/" represents a logic NOT and "*" represents a logic AND.

FIG. 6 discloses a pinout of a 1M×4 parity DRAM according to the invention having four good quadrants accessible by pins DQ1-DQ4, respectively. FIG. 7 discloses a pinout of a 1M×2 parity DRAM salvaged from a 1M×4 parity DRAM, according to the invention.

While this invention has been described with reference to an illustrative embodiment, this description is not intended to be construed in a limiting sense. For example, this invention should be applicable to other memory devices having arrays and quadrants with one input corresponding to one quadrant. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A memory device, comprising:
   plural quadrants of memory arrays,
   plural access inputs, there being one access input for each quadrant, and each access input is coupled to one quadrant of the plural quadrants of memory arrays;

steering circuitry for coupling the access input of an unrepairable memory quadrant to an alternative quadrant; and circuitry for masking out non-selected quadrants.

2. A device according to claim 1 wherein said circuitry for masking out non-selected quadrants includes at least one fuse circuit.

3. A device according to claim 1 wherein said steering circuitry includes pass gates.

4. A device according to claim 1 wherein said steering circuitry includes logic gates.

5. A device according to claim 1 wherein said non-selected quadrants are unrepairable.

6. A device according to claim 1 wherein said memory device is a DRAM.

7. A device according to claim 6 wherein said DRAM is a 1M×4 parity DRAM.

8. A device according to claim 6 wherein said memory device is a 1M×2 parity DRAM derived from a 1M×4 parity DRAM.

9. A method of masking out an unrepairable memory quadrant with an alternative quadrant in a memory device having plural quadrants of memory arrays and plural access inputs, there being one access input for each quadrant, comprising the steps of:

forming steering circuitry for coupling one of the access inputs to any one of the alternative quadrants;

programming said steering circuitry for coupling the access inputs to the alternative quadrants; and forming circuitry for masking out memory quadrants.

10. A method according to claim 9 wherein said memory device is a DRAM.

11. A method according to claim 9 wherein said DRAM is a 1M×4 parity DRAM.

12. A method according to claim 9 wherein said circuitry for masking out memory quadrants includes at least one fuse circuit.

13. A method according to claim 9 wherein said steering circuitry includes pass gates.

14. A method according to claim 9 wherein said steering circuitry includes logic gates.

15. A method according to claim 9 wherein a non-selected quadrant is unrepairable.

16. A method according to claim 9 wherein said memory device is a 1M×2 parity DRAM derived from a 1M×4 parity DRAM.

* * * * *